(12) United States Patent
Rzyski

(10) Patent No.: US 6,172,564 B1
(45) Date of Patent: Jan. 9, 2001

(54) INTERMODULATION PRODUCT CANCELLATION CIRCUIT

(76) Inventor: Eugene Rzyski, 3962 Acacia St., Irvine, CA (US) 92616

(*) Notice: Under 35 U.S.C. 154(b), the term of this patent shall be extended for 0 days.

(21) Appl. No.: 09/363,895

(22) Filed: Jul. 30, 1999

(51) Int. Cl.[7] .................................................. H03F 1/26
(52) U.S. Cl. ......................... 330/149; 375/296; 455/126
(58) Field of Search .............................. 330/149; 375/296, 375/297; 455/126

(56) References Cited

U.S. PATENT DOCUMENTS

| | | | |
|---|---|---|---|
| 4,268,802 | * 5/1981 | Fisher et al. ................................ 332/37 |
| 4,580,105 | 4/1986 | Myer ........................................ 330/149 |
| 4,818,996 | 4/1989 | Kimura ..................................... 341/144 |
| 4,926,134 | * 5/1990 | Olver ........................................... 330/2 |
| 4,992,754 | * 2/1991 | Blauvelt et al. ........................... 330/149 |
| 5,023,565 | * 6/1991 | Lieu ......................................... 330/149 |
| 5,077,532 | 12/1991 | Obermann et al. ...................... 330/151 |
| 5,119,040 | 6/1992 | Long et al. ............................... 330/149 |
| 5,157,345 | 10/1992 | Kenington et al. ...................... 330/149 |
| 5,323,119 | 6/1994 | Powell et al. ............................ 330/151 |
| 5,334,946 | 8/1994 | Kenington et al. ...................... 330/144 |
| 5,365,187 | 11/1994 | Hornak et al. ............................. 330/10 |
| 5,455,537 | 10/1995 | Larkin et al. .............................. 330/52 |
| 5,459,680 | 10/1995 | Zimmerman et al. ................... 364/721 |
| 5,524,281 | 6/1996 | Bradley et al. ......................... 455/67.3 |
| 5,528,196 | 6/1996 | Baskin et al. ............................ 330/151 |
| 5,619,168 | 4/1997 | Myer ........................................ 330/149 |
| 5,621,354 | 4/1997 | Mitzlaff ..................................... 330/52 |
| 5,623,227 | 4/1997 | Everline et al. ............................. 330/2 |
| 5,742,201 | 4/1998 | Eisenberg et al. .......................... 330/2 |
| 5,758,275 | 5/1998 | Cox et al. ................................ 455/307 |
| 5,808,512 | 9/1998 | Bainvoll et al. ......................... 330/151 |
| 5,886,573 | 3/1999 | Kolanek ..................................... 350/10 |
| 5,892,397 | 4/1999 | Belcher et al. .......................... 330/149 |
| 5,903,819 | 5/1999 | Romesburg ................................ 455/63 |
| 5,907,624 | 5/1999 | Takada .................................... 381/94.2 |
| 5,917,375 | * 6/1999 | Lisco et al. .............................. 330/151 |
| 5,994,957 | * 11/1999 | Myer ....................................... 330/151 |

* cited by examiner

*Primary Examiner*—Robert Pascal
*Assistant Examiner*—Henry Choe
(74) *Attorney, Agent, or Firm*—Drummond & Duckworth

(57) ABSTRACT

A cancellation circuit is provided for canceling undesirable intermodulation (IM) products in electrical circuitry. The IM cancellation circuit includes a stepping spectrum analyzer which recognizes and measures the frequencies and amplitudes of different signal components of an RF signal across a desired frequency band. This information is forwarded to a processor which contains look-up tables or the like which provides information relating to the frequencies and/or amplitudes of signal components which are intended to reside in the RF signal. By comparison of the look-up tables to the frequencies and amplitudes measured and recognized by the sweeping spectrum analyzer, the processor of the cancellation circuit is able to determine whether the signal components in the RF signal are intended "information" carrying signals or unintended IM products. Where the processor has determined that a signal component is an unintended IM product, the processor controls a variable voltage controlled oscillator and variable amplifier to create a cancellation signal having an identical frequency and amplitude as the frequency and amplitude of the IM product. A phase shifter is provided to shift the phase of the cancellation signal 180° with respect to the IM product and the cancellation signal is combined with the RF signal to produce an output signal having the IM product canceled.

14 Claims, 6 Drawing Sheets

INTERMODULATION PRODUCT CANCELLATION CIRCUIT

BACKGROUND OF THE INVENTION

The present invention relates to the reduction of distortion in electrical circuitry. More particularly, the present invention relates to distortion reduction circuitry particularly suitable for amplifiers.

Radio frequency (RF) systems, such as cellular and microwave communication systems, typically require input signals to be fed into an RF power amplifier. Unfortunately, all amplifiers tend to distort the input signal at some power level and to generally cause the amplifier output to contain undesirable distortion products, spurious products, noise perturbations and intermodulation (IM) products. For purposes of simplicity, these will collectively be referred to as IM products. These IM products can cause undesirable interference over the amplifier frequency range. It is for these reasons that most amplifiers must incorporate some form of correction mechanism into the signal flow path through the amplifier.

One conventional method for reducing IM products uses a spectral analysis approach. This approach involves scanning the output of the amplifier using a receiver tuned to the frequency of candidate IM products. The IM level is measured and a linearizer is manually adjusted to minimize the IM product. This procedure is repeated until each of the IM products have a magnitude below a predetermined acceptable level. In a similar approach, as described in U.S. Pat. No. 4,580,105 issued to Myer, a portion of the output signal is taken and combined with an input signal which has been adjusted in phase and amplitude. The signal combination isolates the distortion component which is then adjusted in phase and gain. This isolation distortion component is then added back to the output signal by means of a coupler to eliminate the distortion component. Unfortunately, the amount of distortion reduction available using this feed forward technique is limited by the accuracy of the gain and phase adjustments.

In addition, there appears to be a problem in the number of samples realized in several basic feed forward techniques. Samples in these systems are available only at the time that the phase detector circuit detects a correlated signal. This leads to poor error signal resolution and it is this error signal that is used to cancel corresponding spurs.

Moreover, it is believed that many cellular communication base stations do not function at full capacity because of serious linearity problems in the base station's components. In addition, the need for increased capacity accompanying the expansion of cellular communications is forcing requirements for transmission standards of RF equipment to become too stringent to be met by construction of most present day amplifier circuits. Moreover, both time division multiple access (TDMA) and code division multiple access (CDMA) modulation require greater linearity and an absence of IM products that can not be routinely obtained by presently available high efficiency RF power amplifiers. Accordingly, it is clear that present correction techniques for eliminating IM products are not acceptable for evolving communications systems.

Thus, there is a need for a cancellation circuit which reduces IM products in electronic circuitry such as power amplifiers.

It would also be highly advantageous if the IM cancellation circuit were inexpensive to manufacture and highly reliable.

Moreover, it would be highly advantageous if the IM cancellation could be provided in a compact and lightweight constriction.

SUMMARY OF THE INVENTION

Briefly, in accordance with the invention, I provide an improved apparatus and method for automatically reducing IM products in electrical circuits. It is believed that this IM cancellation circuit is particularly suitable for application with amplifiers which amplify an input carrier signal.

In its most basic form, the IM product cancellation circuit includes a first coupler for sampling an input carrier signal. The coupler isolates a portion of the signal, preferably 6 dB below the input carrier signal so as to not substantially affect the energy level of the input carrier signal. This sample signal is then routed to a stepping spectrum analyzer which detects and measures the frequency and amplitude of the signal components of the carrier signal including its intended components and any IM products in the carrier signal. The stepping spectrum analyzer transmits the information relating to the frequency and amplitude of the different signal components in the carrier signal to a processor. Meanwhile, the processor stores information relating to the identity of the amplitude and/or frequency or frequency bands of intended signal components in the carrier signal. This information is typically in the form of look-up tables which identifies the amplitude or frequency, or in the case of TDMA or CDMA systems, the frequency band where the intended signal components are expected to reside. In this manner, the processor, by referencing this look-up table, can determine whether the signal components detected and measured by the stepping spectrum analyzer are intended signal components or unintended IM products.

The IM product canceling circuit further includes a variable voltage controlled oscillator, variable amplifier and variable phase shifter. The voltage controlled oscillator, amplifier and phase shifter are connected in series for creating an oscillator signal which can be controlled in amplitude and phase. The operation of the voltage controlled oscillator, amplifier and phase shifter are all controlled by the processor. Upon recognition and measurement of an IM product by the stepping spectrum analyzer and processor, the processor controls the voltage controlled oscillator, amplifier and phase shifter to produce an oscillating signal which is substantially identical in amplitude and frequency to a detected IM product but shifted in phase by 180°. This oscillating signal acts as an IM cancellation signal as the signal is fed back into the original carrier signal by means of a coupler or the like, such as a combiner. The original carrier signal is then output from the coupler retaining all of the original characteristics of the intended signal components except that the unintended IM product is canceled by the cancellation signal.

In a preferred embodiment, the IM cancellation circuit includes a feedback circuit. After the IM product is canceled, the output carrier signal is sampled by splitting the output signal with a coupler or the like to produce a sample of the output carrier signal. This sample of the output carrier signal is routed back to, in turn, the stepping spectrum analyzer and processor. The stepping spectrum analyzer and processor are thus able to confirm that the IM product has been canceled. In the alternative, where it has been determined that the cancellation signal is being transmitted at an incorrect frequency, amplitude or phase, the voltage controlled oscillator, amplifier and phase shifter are automatically adjusted by the processor until the cancellation signal correctly cancels the unintended IM product.

As would be understood by those skilled in the art, the aforementioned described cancellation circuit would only cancel a single unintended IM product. Where the carrier signal is likely to have more than one unintended IM product, the cancellation circuit is provided with a plurality of variable voltage controlled oscillators, variable amplifiers and variable phase shifters. Each set of these voltage controlled oscillators, amplifiers and phase shifters are connected in series to the processor for creating a plurality of cancellation signals where necessary.

In an additional preferred embodiment, the IM product cancellation signal is adapted for use with an amplifier. A portion of the output from the amplifier is forwarded to the stepping spectrum analyzer for recognition and measurement of not only the intended signal components but also any IM products. This information is sent to the processor which determines whether the signals received by the stepping spectrum analyzer are intended signal components or unintended IM products. Whether the carrier signal includes IM products can be determined by comparison of the received signals to look-up tables which identify the amplitude and/or frequency band of the intended signal components. If a detected signal is not listed in the look-up table, the signal is recognized as an IM product.

In an additional embodiment, the amplifier input signal is split with a first component going to the amplifier and a second component, typically 6 DB below the signal input to the amplifier, being sent to the stepping spectrum analyzer for analysis. The frequencies of signals originally input in the amplifier are identified as intended signal components and stored in the processor. The frequencies of the intended signal components are then compared with the frequencies of signals output from the amplifier. IM products can then be identified as appearing at frequencies not appearing in the amplifier input signal. The processor then controls the variable voltage controlled oscillator and variable amplifier to produce a cancellation signal having a frequency and amplitude substantially equal to the frequency and amplitude of the IM product. The cancellation signal is then shifted in phase 180° with respect to the phase of the IM product and combined with the carrier signal by means of a coupler or the like. The resulting carrier signal is thus "cleansed" with the IM product removed.

In still an additional preferred embodiment, the amplifier circuit includes a traditional feed forward correction circuit. The feed forward correction circuit will typically cancel much of the noise and IM products of an amplifier. However, the components of the feed forward correction circuit, such as combiners, amplifiers and phase shifters, etc., typically add additional IM products to the amplifier output. These IM products can be canceled by application of the IM cancellation circuit of the present invention. As described above, the output signal from the amplifier is split with a component going to the stepping spectrum analyzer. IM products are then recognized by the processor by use of a look-up table or by comparison to an analysis of the original amplifier input signal. The processor then controls the variable controlled oscillator, variable amplifier and variable phase shifter to produce a cancellation signal substantially equal in frequency and amplitude to the IM product but shifted in phase by 180°. This cancellation signal is then combined with the amplifier output signal to cancel the unintended IM product.

A preferred embodiment of the stepping spectrum analyzer for use in application with the present invention is substantially similar to the automated frequency stepping noise measurement test system disclosed and described in copending U.S. patent application Ser. No. 09/313,435 which is incorporated by reference herein. In a preferred embodiment, the stepping spectrum analyzer includes a variable low noise source for producing a low noise signal having an adjustable frequency. The variable low noise source includes two outputs for outputting identical low noise signals, or is coupled to a splitter for splitting a low noise signal into two identical low noise signals. The first low noise signal is routed to a coupler which combines the first low noise signal with that portion of the input carrier signal comprising the sample signal. The second low noise signal is routed to a variable phase shifter which adjust the phase of the second low noise signal to be 90° out of phase (in phase quadrature) with respect to the first low signal which has been combined with the sample signal. The sample signal, carrying the intended carrier signal components and any unintended IM products, and the first low noise signal are then sent together to a mixer where the signal is mixed with the second low noise signal which has been adjusted in phase. Due to the inherent characteristics of a mixer, the low noise source signals are canceled in the mixer output signal by having the second low noise signal shifted in phase 90° with respect to the first low noise signal. Moreover, the mixer is nonlinear producing an output signal including only a single sideband with respect to the frequency of the low noise signal but having double the amplitude. The signal output from the mixer, hereinafter referred to as a "measurement test signal", is then sent to a variable low noise matching amplifier. The variable low noise matching amplifier both amplifies the measurement test signal and acts as a buffer. The matching variable amplifier is constructed to add very low noise or IM products so as to not interfere with the IM measurements by the stepping spectrum analyzer and provides for amplification of the measurement test signal to enhance the ability of the stepping spectrum analyzer to measure any IM products in the original sample signal.

After passing through the low noise matching amplifier, the measurement test signal is sent to an analog-to-digital convertor (ADC) which converts the analog measurement test signal into digital data. The digital data is then transmitted to a processor for evaluation. The processor of the stepping spectrum analyzer may be separate and independent from the processor which controls the variable voltage controlled oscillator, variable amplifier and phase shifter which creates the IM product cancellation signal, or both processor functions may be combined in a single processor. The processor of the stepping spectrum analyzer uses standard, windowed, fast or discreet fourier transforms to accurately measure the characteristics of the measurement test signal and whether it includes any IM products. These fourier transforms are known to those skilled in the art and will not be discussed in detail herein.

The processor of the stepping spectrum analyzer is connected to a plurality of control lines to the variable amplifier, variable low noise source, variable phase shifter and variable low noise matching amplifier. These control connections enable the processor to automatically set levels and make adjustments to the amplifier, low noise source, phase shifter and matching amplifier to "step" the low noise source across a desired frequency band at different offset frequencies in order to identify the IM products in that frequency band. To control the stepping spectrum analyzer, the processor takes the digitized output from the ADC to both calibrate the system and to ensure that the amplifier, low noise source and phase shifter are set to correct levels. More particularly, the output from the ADC enables the processor to determine whether the low noise source is providing the first and second low noise signals at a correct frequency. By evaluating the output from the ADC, the processor can also confirm that the phase shifters are properly maintaining the signals received by the mixer in phase quadrature. If any of these components are not functioning optimally, the processor automatically makes required adjustments to ensure proper recognition and measurement of any IM products in the carrier signal. Once the frequency characteristics are recognized and measured by the stepping spectrum analyzer, this signal information is sent to the processor which controls the variable voltage controlled oscillator, variable amplifier and variable phase shifter which produce the cancellation signal. This processor (by comparison of the signal information to internal look-up tables) determines whether the carrier signal is carrying any unintended IM products and controls the variable controlled oscillator, variable amplifier and variable phase shifter to produce a cancellation signal which is combined with the carrier signal to cancel an unintended IM product.

It is thus an object of the present invention to provide an improved apparatus and method for canceling IM products in electronic circuitry.

It is an additional object of the present invention to provide an IM cancellation circuit which is inexpensive to manufacture, highly reliable, compact and of lightweight construction.

These and other further advantages of the present invention will be appreciated by those skilled in the art upon reading the following detailed description with reference to the attached drawings.

DETAILED DESCRIPTION OF THE INVENTION

Figure 1:
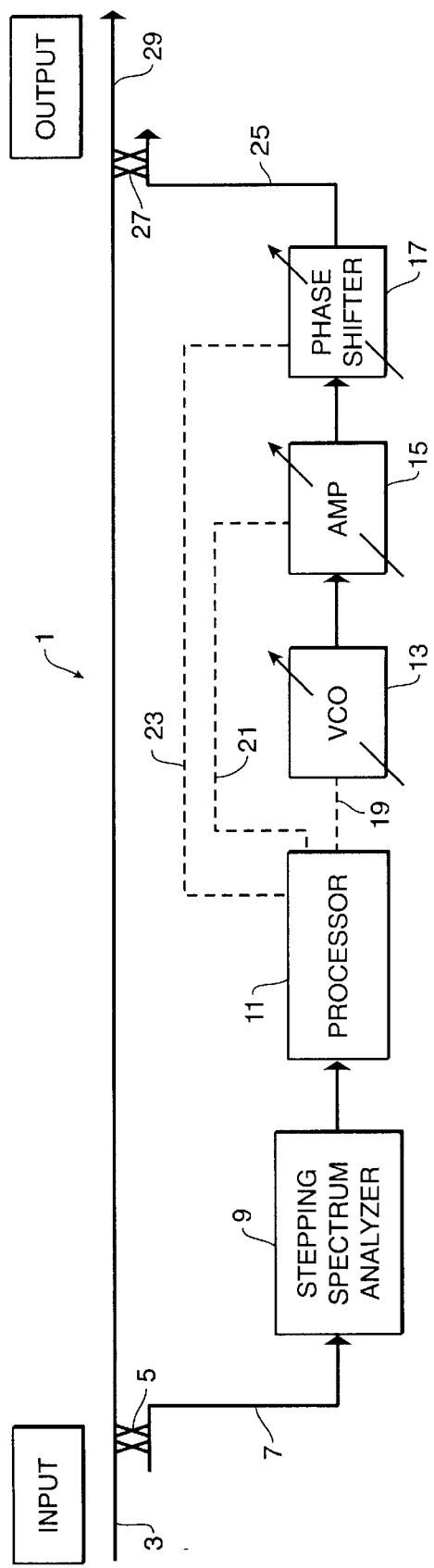
FIG. 1 is a diagram showing a simplified IM product cancellation circuit of the present invention.

While the present invention is susceptible of embodiment in various forms, there is shown in the drawings and will hereinafter be described the presently preferred embodiments of the invention with the understanding that the present disclosure is to be considered as an exemplification of the invention and is not intended to limit the invention to the specific embodiments illustrated.

Figure 6:
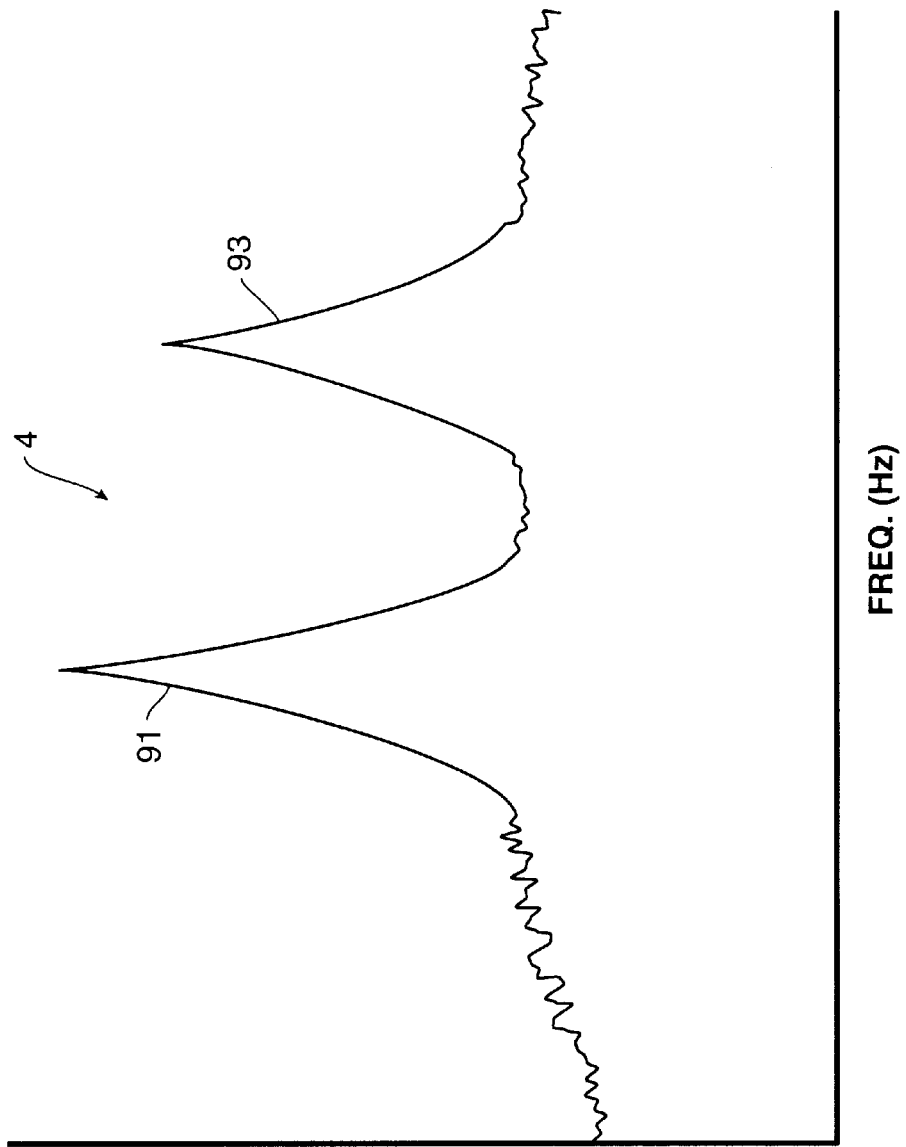
FIG. 6 is a graphical depiction, as would be shown on the display of a traditional spectrum analyzer, illustrating a carrier signal carrying both an intended signal and an unintended IM product.

With reference to FIGS. 1 & 6, the IM product cancellation circuit 1 of the present invention includes a stepping spectrum analyzer 9, a processor 11, a variable voltage controlled oscillator 13, variable amplifier 15 and variable phase shifter 17. A carrier signal 4 which is intended to have its IM products canceled is received by an input 3. The carrier signal is then split by a coupler 5 with a portion, typically 6 dB below the input carrier signal, being sent to the stepping spectrum analyzer 9. The signal sent to the stepping spectrum analyzer 9, hereinafter referred to as a sample signal 7, is analyzed by the stepping spectrum analyzer 9 for detection and measurement of the frequency and amplitude of signal components in the input carrier signal. These signal components which comprise the carrier signal 4 include both intended signal components 91 and any unintended IM products 93 (See FIG. 6). Once the stepping spectrum analyzer 9 has stepped across a frequency band of interest and recognized the frequency and amplitude of the different signal components of the carrier input signal within that frequency band, this information is sent to the processor 11.

The processor 11 stores information relating to the identity of the frequency and/or frequency bands within which the intended signal or signals are expected to reside within the carrier input signal. This information relating to the intended signal components is typically stored in the form of look-up tables which identifies the amplitude or frequency or frequency band where the intended signal components of the carrier input signal 4 are intended to be located within. The processor 11, by cross referencing the information provided by the stepping spectrum analyzer 9 relating to recognized signals in the carrier input signal 4 with the information stored in the look-up table, can determine whether there are any unintended IM products within the carrier input signal 4. Simply, any signal components identified by the stepping spectrum analyzer 9 which are not listed by amplitude frequency in the processor look-up table are determined to be IM products 93.

Figure 7:
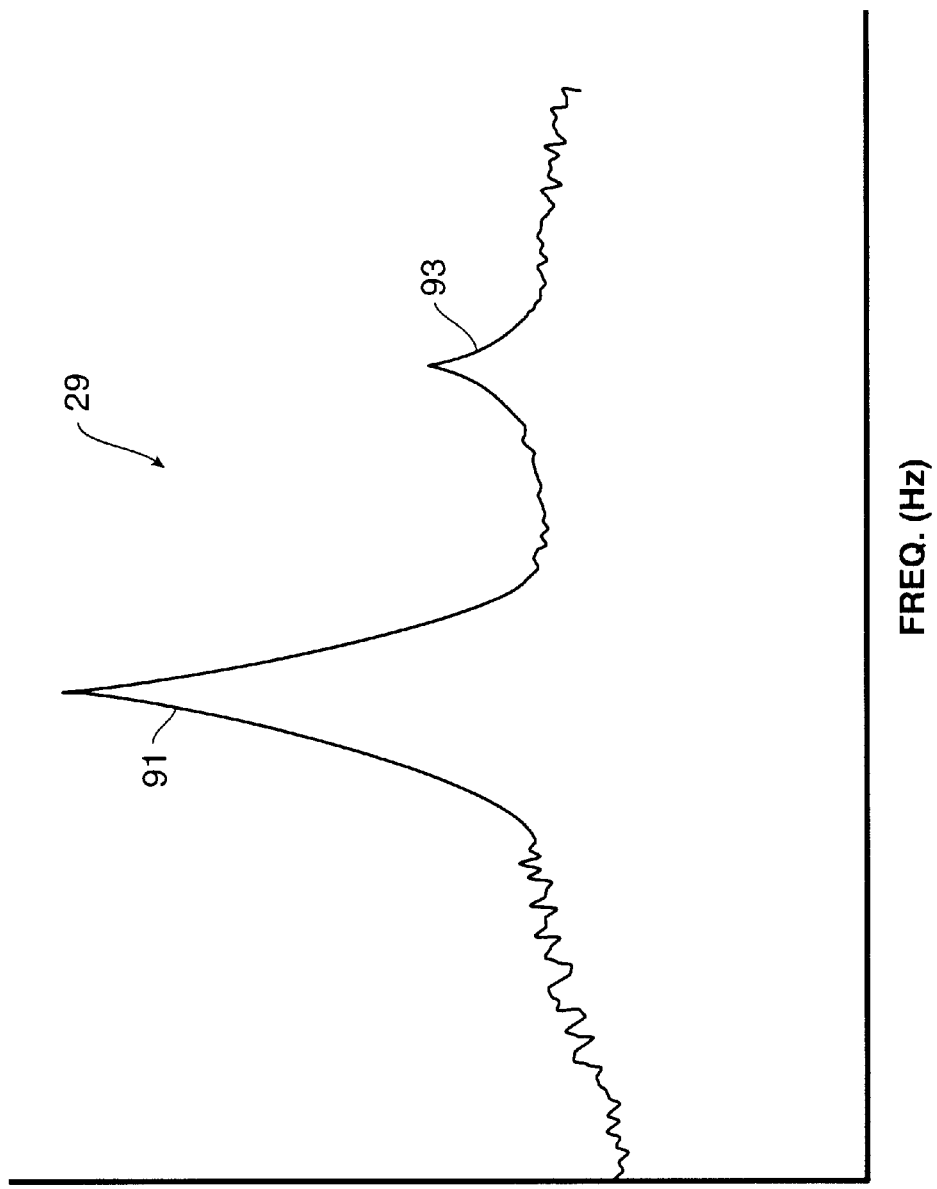
FIG. 7 is a graphical depiction, as would be shown on the display of a traditional spectrum analyzer, illustrating the carrier signal shown in FIG. 6 with the IM product being substantially canceled by application of the IM product cancellation circuit of the present invention.

The IM product cancellation circuit 1 of the present invention further includes a plurality of control lines 19, 21 and 23 which connect the processor 11 with the variable voltage controlled oscillator 13, variable amplifier 15 and variable phase shifter 17, respectively. By means of these control lines 19, 21 and 23, the processor 11 instructs the variable voltage controlled oscillator 13 and variable amplifier 15 to create an oscillating signal which is identical in frequency and amplitude to a detected unintended IM product. This oscillating signal acts as a cancellation signal 25 which is adjusted in phase by the variable phase shifter 17 to be 180° with respect to the phase of the IM product in the carrier input signal 4. With reference also to FIG. 7, the cancellation signal 25 is then combined with the original carrier input signal 4 by a second coupler 27 or the like to create an output signal 29. As would be understood by those skilled in the art, the output signal 29 is identical to the original carrier input signal 4, retaining all of its original frequency and amplitude characteristics of the intended signal components 91, except that the unintended IM product 93 has been canceled by the cancellation signal 25.

Figure 2:
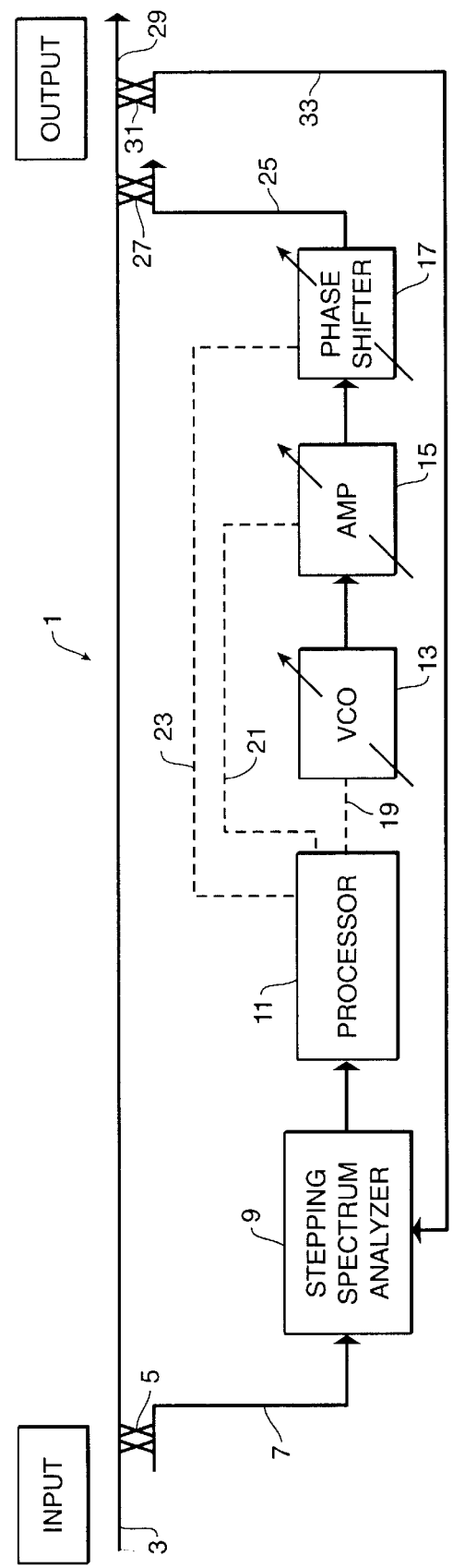
FIG. 2 is a diagram showing the IM product cancellation circuit of the present invention including a feedback circuit.

With reference to FIG. 2, in a preferred embodiment, the IM product cancellation signal 1 includes an additional feedback circuit which includes a third coupler 31 creating a feedback signal 33. After the IM product is canceled by combining the cancellation signal 25 with the carrier input signal 4, the resulting output signal 29 is split by a coupler 31 or the like which isolates a portion of the output signal 29, again preferably 6 dB below the output signal 29 so as to create feedback signal 33. The feedback signal 33 is then routed back to the stepping spectrum analyzer 9 wherein it is analyzed across the desired frequency band to confirm that the previously detected IM product has been properly canceled. Where the IM product has not been properly canceled, the processor 11 can adjust the variable voltage controlled oscillator 13, variable amplifier 15 and/or variable phase shifter 17 to ensure that the cancellation signal 25 has the proper frequency, amplitude and phase shift to properly cancel the IM product in the carrier input signal 4.

Figure 3:
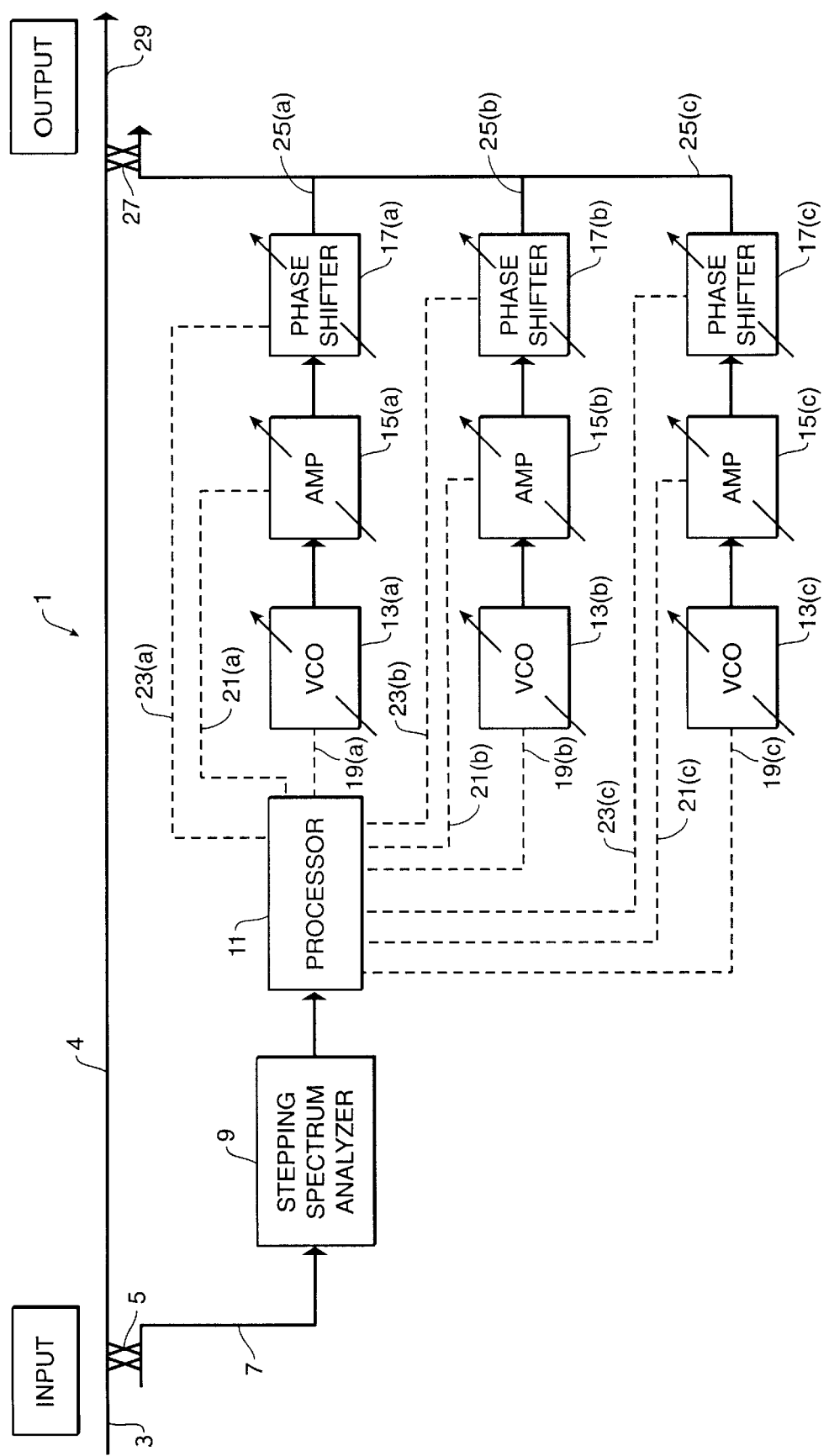
FIG. 3 is a diagram illustrating the IM product cancellation circuit of the present invention including a plurality of variable voltage controlled oscillators, variable amplifiers and variable phase shifters for producing a plurality of IM product cancellation signals.

The previously described IM product cancellation circuit 1 is only capable of canceling a single unintended IM product. With reference to FIG. 3, in a preferred embodiment, the cancellation circuit 25 includes a plurality of variable voltage controlled oscillators 13a–c, variable amplifiers 15a–c and variable phase shifters 17a–c. Each set of variable voltage controlled oscillators 13a–c, variable amplifiers 15a–c and phase shifters 17a–c are connected in series and connected to the processor 11 by control lines 19a–c, 21a–c and 23a–c for enabling the processor 11 to create a plurality of controllable oscillating signals which can be adjusted in amplitude by the variable amplifiers 15a–c and phase by the variable phase shifters 17a–c. For example, FIG. 3 shows three (3) sets of variable controlled oscillators 13a–c, variable amplifiers 15a–c and variable phase shifters 17a–c which are capable of producing three (3) cancellation signals 25a–c. Where the stepping spectrum analyzer 9 and processor 11 have measured and recognized three (3) IM products, the variable voltage controlled oscillators 13a–c and variable amplifier 15a–c are adjusted to produce three (3) cancellation signals 25a–c having the same frequency and amplitude as the three IM products recognized by the stepping spectrum analyzer 9 and processor 11. These cancellation signals 25a–c are then individually shifted in phase by phase shifters 17a–c so that they are each shifted 180° with respect to the IM product with which they are intended to cancel. Each of these cancellation signals 25a–c are then coupled back to the carrier input signal 4 to create an output signal 29. Again, the output signal 29 includes all of the signal characteristics of the carrier input signal 4 except that the three (3) detected IM products have now been canceled.

Figure 5:
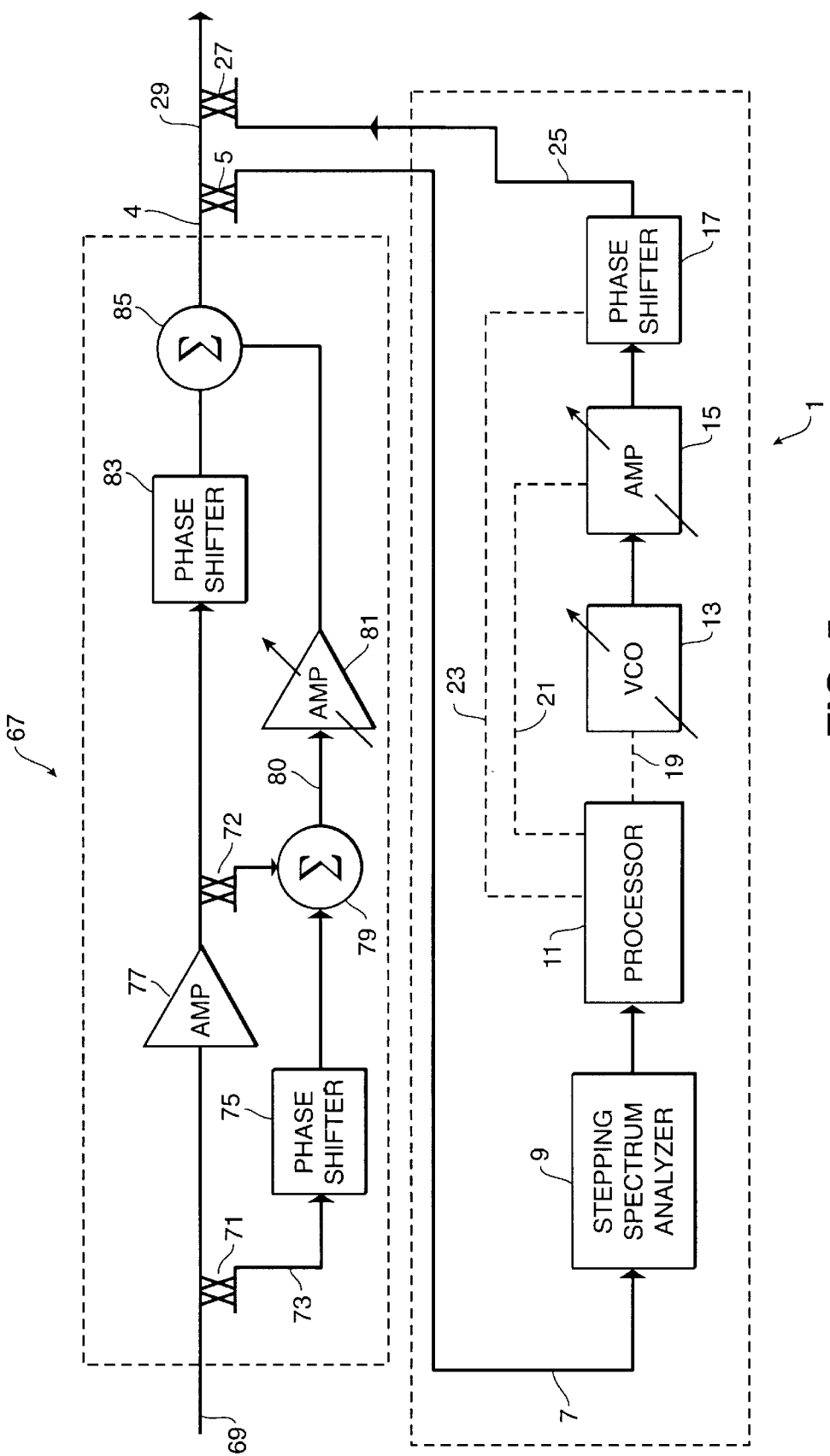
FIG. 5 is a diagram illustrating an amplifier circuit incorporating a traditional feed forward correction circuit and an IM product cancellation circuit of the present invention.

The IM product cancellation circuit 1 of the present invention is believed to be particularly applicable to the cancellation of IM products in amplifiers. Typically, amplifiers use some sort of feed forward correction circuit (FFCC) in an effort to cancel the IM products created by an amplifier. Unfortunately, though a feed forward correction circuit often substantially cancels the IM products of the amplifier itself, the feed forward correction circuit introduces additional IM products as a result of the additional components of the feed forward correction circuit, such as phase shifters, variable amplifiers and combiners. These IM products are then output as part of the amplifier output signal. With reference to FIG. 5, the IM product cancellation circuit 1 of the present invention can be used to cancel the IM products of a feed forward correction circuit 67 employed to cancel the IM products of a primary amplifier 77. For purposes herein, the term "primary amplifier" is intended to be used in the broadest sense to include any amplifiers, such as RF amplifiers, IF amplifiers, power amplifiers, etc. A primary amplifier 77 employing a feed forward correction circuit 67 typically includes additional phase shifters 75 and 83, a variable amplifier 81 and combiners 79 and 85. An input signal 69 is split by a coupler 71 with a first portion of the input signal 69 being shifted 90° by phase shifter 75 and sent to a combiner 79. The predominant portion of the input signal 69 is routed to the primary amplifier 77 and amplified accordingly. A portion of this amplified signal, including any IM products, is isolated by an additional coupler 72 and also sent to combiner 79. The portion of the amplified signal which is sent to the combiner 79 is combined with the phase shifted input signal 73 in the combiner 79 which results in a first combiner output signal 80. The original signal components of signal 69 are substantially canceled and instead the first combiner output signal 80 includes only the IM products of the amplifier 77. Meanwhile, the amplifier output signal is phase shifted by 180° by the second phase shifter 83 and sent to a second combiner 85. This phase shifted amplifier signal is mixed with the first combiner output, which includes only the IM products created by the amplifier. This first combiner output is adjusted in amplification by amplifier 81 to have substantially the same amplitude as the IM products of the amplifier output signal. Because the amplifier output signal has been phase shifted by 180° by the phase shifter 83, the IM products of the primary amplifier are substantially canceled in output carrier signal 4.

With reference to FIGS. 1, 5, 6 & 7, in order to cancel the additional IM products created by the components of feed forward correction circuit 67, the carrier signal 4, output by the feed forward correction circuit, is split by a coupler 5 with a portion of the output signal 7 being sent to the stepping spectrum analyzer 9. The stepping spectrum analyzer 9 steps across a desired frequency band in an effort to recognize the intended signal components 91 and unintended IM products 93 of the carrier signal 4. In similar manner to as described above, the stepping spectrum analyzer 9 forwards the information regarding the frequency and amplitude of the different signals that were recognized in the carrier signal 4 to the processor 11 which cross references this information with an internal look-up table which stores information regarding the frequency of the intended output signals of the amplifier 77. Any signals uncovered by the stepping spectrum analyzer 9 which are not listed in this internal look-up table are thus determined to be unintended IM products. Upon recognition of these unintended IM products 93, the processor 11 controls the variable voltage controlled oscillator 13 and variable amplifier 15 to create a cancellation signal 25. The phase shifter 17 then shifts the phase of the cancellation signal 25 by 180° with respect to the IM products of the carrier signal 4 and the cancellation signal 25 is thereafter combined back with the carrier signal 4 to create an output signal 29. Because the cancellation signal 25 has the same frequency and amplitude as the IM products 93 but a shift of phase of 180°, the output signal 29 includes all of the frequency and amplitude characteristics of the intended signal components 91 of the signal created by the amplifier 77 but the unintended IM products 93 have been canceled.

With reference to FIG. 5, in an additional preferred embodiment, prior to the input signal 69 being received by the amplifier 77 or the feed forward correction circuit 67, the input signal 69 is split by a coupler (not shown) for isolating a portion of the input signal (not shown). This portion of the input signal is then forwarded to the stepping spectrum analyzer 9 for analysis which forwards the results, including determination of frequency and amplitude components of input signal 69, to the processor 11 which stores this information in look-up tables or the like to provide the processor 11 with information relating to the intended frequency and amplitude characteristics of the input signal 69.

Since this information does not include any of the IM products created by the amplifier 77 or feed forward correction circuit 67, the sample signal 7 can be compared with the information now stored in the look-up table to identify the IM products of the carrier signal 4 which were created by the amplifier 77 or feed forward correction circuit 67. This information can, in turn, be used to control the variable voltage controlled oscillator 13, variable amplifier 15 and variable phase shifter 17 to create a cancellation signal 25.

Figure 4:
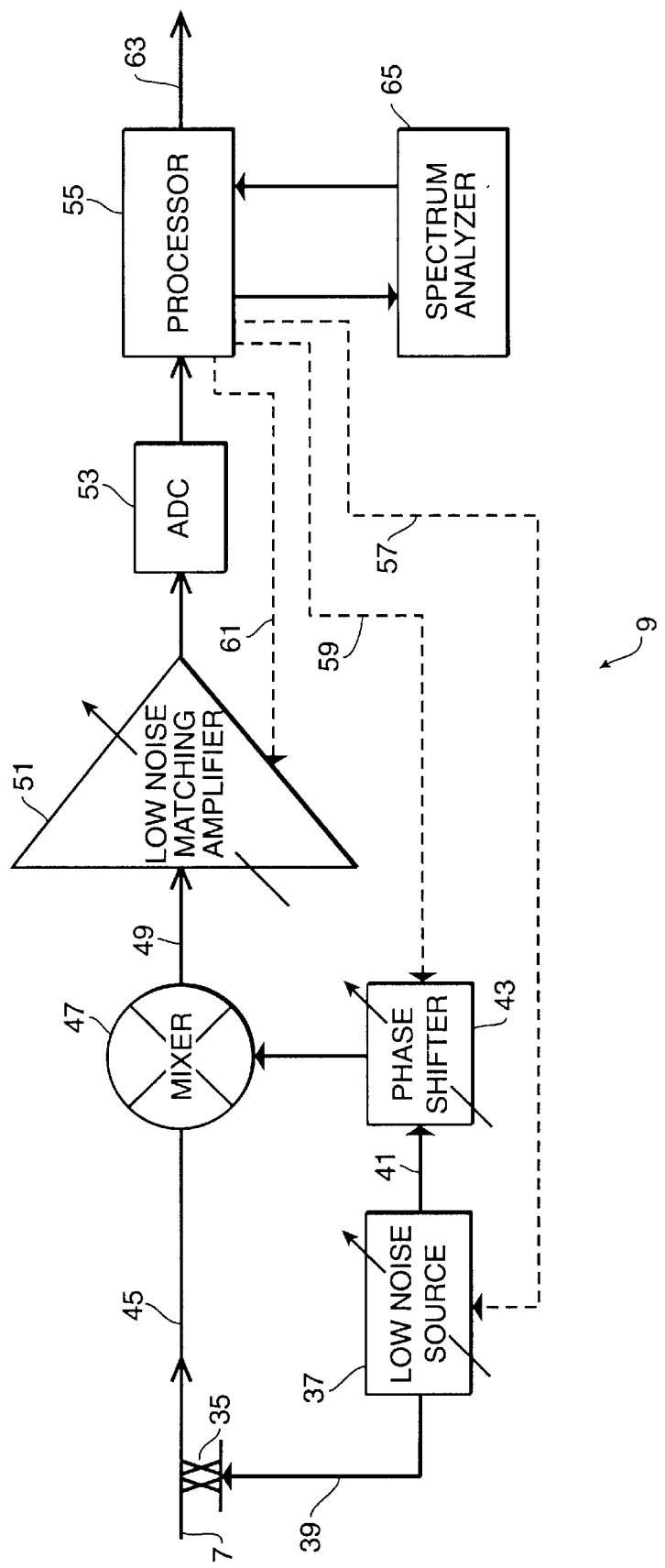
FIG. 4 is a diagram illustrating a preferred embodiment of the stepping spectrum analyzer utilized by the IM product cancellation circuit of the present invention.

As would be understood by those skilled in the art, it is important that the stepping spectrum analyzer 9 quickly and thoroughly analyze a frequency band of interest to determine the frequency and amplitude of the different signal components of a carrier signal, particularly any unintended IM products. Referring to FIG. 4, a preferred stepping spectrum analyzer 9 includes a variable low noise source 37, variable phase shifter 43 and mixer 47. The variable low noise source 37 creates first and second adjustable oscillating signals 39 and 41 which are identical in frequency and amplitude. The first low noise signal 39 is combined with the sample signal 7 by a coupler 35 to create a combined sample signal/low noise signal 45. Meanwhile, the second low noise signal 41 is shifted in phase by 90° by a phase shifter 43. The sample signal/low noise signal 45 and second low noise signal 41 are combined in a mixer 47 to create a mixer output signal 49. Due to the inherent characteristics of the mixer 49, the low noise source signals 39 and 41 are canceled and the remaining signal components appear in the form of "offset-from-carrier". Basically, the signal components in the mixer output signal 49 have been quadrature downconverted to baseband. For example, if the low noise source signals 39 and 41, acting as carrier signals are produced at 500.000 MHz, then a signal component in the sampling signal 7 of 500.050 MHz would appear as a signal of 50 kHz in the mixer output signal 49. This mixer output signal 49, hereinafter referred to as a measurement test signal, is sent to a low noise matching amplifier 51 which amplifies the magnitude of the measurement test signal 49 so that any IM products in the signal can be more easily recognized and measured. Moreover, the low noise matching amplifier 51 acts as a buffer to ensure that the impedance is optimally maintained between the mixer 47 and an analog-to-digital convertor 53 which receives the measurement test signal 49 after it has passed through the low noise matching amplifier 51.

The analog-to-digital convertor 53 receives the measurement test signal 49 and converts the test signal in a first-in, first-out manner into a digital format. This digital information is then forwarded to a processor 55. The stepping spectrum analyzer 9 further includes a plurality of control lines 57, 59 and 61 which connect the processor 55 to the variable low noise source 37, variable phase shifter 53 and low noise matching amplifier 51, respectively. In operation, the processor 55 adjusts the low noise source 37 and phase shifter 53 across a desired frequency band at different offset frequencies so as to produce different carrier signals which are received by the mixer 47. Though typical spectrum analyzing systems require manual adjustments of a low noise source and phase shifter, the stepping spectrum analyzer 9 of the present invention provides for automatic control of these components so that the intended signal components and unintended IM products of the sample signal 7 can be recognized and measured across an entire bandwidth of interest.

Still with reference to FIG. 4, after reaching the processor 55, the measurement test signal 49 is routed to a spectrum analyzer 65. The measurement test signal 49, now in digital format as converted by the analog-to-digital converter 53, is analyzed by the spectrum analyzer 65 using discreet fourier transforms that accurately measure the different frequency components of the sample signal 7 including the frequency and amplitude of any intended signal components and any unintended IM products. This information is then sent back to the processor 55 and, with reference to FIG. 1, to the processor 11 which controls the variable voltage controlled oscillator 13, variable amplifier 15 and variable phase shifter 17. The processor 11 then takes this information and determines whether the frequency components are intended signal components or unintended IM products by comparison to an internal look-up table. Once the IM products have been defined, the variable controlled oscillators 13, variable amplifiers 15 and phase shifters 17 are adjusted through control links 19, 21 and 23 by the processor 11 to create cancellation signal 25 which is combined with carrier signal 4 to create an output signal 29 having an unintended IM product being canceled. As would be understood by those skilled in the art, processors 11 and 15 may be constructed as separate processors or combined in a single processor.

The present invention has been described with reference to canceling IM products in RF signals. This description has been made because the present invention is considered to have particular relevance to RF systems. However, the present invention is not intended to be limited to the radio frequency spectrum but is intended to include applications above the radio frequency spectrum including applications in the infrared, visible light, ultra-violet and x-ray spectrum such as fiberoptics and lasers.

Having described my invention in such terms as to enable those skilled in the art to understand and practice it, and having defined and identified the presently preferred embodiments thereof, I claim:

1. An intermodulation (IM) product cancellation circuit for reducing one or more IM products in a carrier signal, the IM product cancellation circuit comprising:

a variable oscillator for producing an IM product cancellation signal;

a variable phase shifter means for shifting said IM product cancellation signal 180° with respect to an IM product in a carrier signal for canceling an unwanted IM product in the carrier signal;

a processor including a memory for storing a look-up table including the identity of the frequency or frequencies of intended signal components of a carrier input signal, said processor connected to said variable oscillator and said variable phase shifter for controlling said variable oscillator and said variable phase shifter means for initiating and maintaining said IM product cancellation signal at substantially the same frequency as the IM product but shifted 180° with respect to the IM product for substantially reducing an unwanted IM product in the carrier signal; and a coupler means for combining the carrier signal with said IM product cancellation signal to produce an output signal the IM product being substantially reduced.

2. The IM product cancellation circuit of claim 1 further comprising an amplifier for controlling the amplitude of said IM product cancellation signal.

3. The IM product cancellation circuit of claim 2 wherein said amplifier is a variable amplifier which is connected to said processor.

4. The IM product cancellation circuit of claim 3 wherein said processor adjusts said variable amplifier so that said IM product cancellation signal has substantially the same amplitude as said IM product for substantially canceling the IM product in the carrier signal.

5. The IM product cancellation circuit of claim 1 further comprises a spectrum analyzer connected to said processor for recognizing and measuring the characteristics of within a desired frequency band.

6. The IM product cancellation circuit of claim 5 wherein said spectrum analyzer is capable of automatically stepping across a desired frequency band for recognizing and measuring the characteristics of a carrier signal within that frequency band.

7. The IM product cancellation circuit of claim 5 wherein said processor includes a look-up table providing information regarding the desired characteristics of said carrier signal for enabling the processor to determine the existence of unwanted IM products by comparison of the results of the analysis by said spectrum analyzer to information stored in said look-up table.

8. The IM product cancellation circuit of claim 6 wherein said processor includes a look-up table providing information regarding the desired characteristics of said carrier signal for enabling the processor to determine the existence of unwanted IM products by comparison of the results of the analysis by said spectrum analyzer to information stored in said look-up table.

9. The IM product cancellation circuit of claim 7 wherein in said cancellation circuit is provided to cancel IM products of a primary amplifier.

10. The IM product cancellation circuit of claim 9 wherein information stored in said look-up table is provided by analysis by said spectrum analyzer of said carrier signal prior to said carrier signal entering said primary amplifier.

11. The IM product cancellation circuit of claim 1 further comprising:
an analog-to-digital converter for converting a portion of the carrier signal into a digital format for analysis and measurement of signal components in the carrier signal.

12. The IM product cancellation circuit of claim 1 wherein said circuit comprises a plurality of variable oscillators, variable amplifiers, and variable phase shifters for producing a corresponding plurality of IM product cancellation signals for canceling a plurality of IM products.

13. A method of canceling unwanted IM product in a carrier signal comprising the steps of:
providing a look-up table including the identity of the frequency or frequencies of intended signal components of a carrier input signal;
sampling the carrier signal to produce a carrier signal sample;
analyzing the carrier signal sample to determine if the carrier signal has an unwanted IM product by comparing the analysis of the carrier signal sample to the look-up table including the frequency or frequencies of intended signal components;
controlling a variable oscillator to produce an IM product cancellation signal having substantially the same frequency as the unwanted IM product;
shifting the IM product cancellation signal 180° with respect to the IM product in the carrier signal; and
combining the carrier signal with the IM product cancellation signal to produce an output signal with the unwanted IM product being substantially canceled by the IM product cancellation signal.

14. The method of canceling unwanted IM products in a carrier signal of claim 13 further comprising the step of:
amplifying the IM product cancellation signal to have substantially the same amplitude as the unwanted IM product prior to combining the carrier signal with the IM product cancellation signal.

* * * * *